United States Patent

Noguchi et al.

[11] Patent Number: 5,841,202
[45] Date of Patent: Nov. 24, 1998

[54] EMI PREVENTION CIRCUIT FOR A CAR-MOUNTED ELECTRONIC CONTROL UNIT

[75] Inventors: Yoichi Noguchi; Nobuo Sasagake; Hiroshi Ohsawa, all of Higashimatsuyama, Japan

[73] Assignee: ZEXEL Corporation, Tokyo, Japan

[21] Appl. No.: 856,580

[22] Filed: May 15, 1997

[30] Foreign Application Priority Data

May 22, 1996 [JP] Japan ................................... 8-150167

[51] Int. Cl.⁶ ................................................ F02P 15/00
[52] U.S. Cl. ............................ 307/10.1; 333/12; 307/91; 174/35 R; 257/528
[58] Field of Search ................................. 307/104, 105, 307/106, 108, 109, 89, 90, 91, 9.1, 10.1; 327/310, 311, 317; 361/816, 817, 818; 174/35 R, 36, 35 C, 250, 251, 260, 261, 268; 333/12, 4; 257/528, 532, 533, 690, 691, 692, 693

[56] References Cited

U.S. PATENT DOCUMENTS

| | | |
|---|---|---|
| 4,482,816 | 11/1984 | Richardson et al. ..................... 307/106 |
| 4,583,056 | 4/1986 | Takeda et al. ............................... 331/67 |
| 4,875,457 | 10/1989 | Fitzner ........................................ 333/12 |
| 4,908,735 | 3/1990 | Tsuneki ...................................... 174/36 |
| 5,023,753 | 6/1991 | Abe ............................................ 361/400 |
| 5,068,631 | 11/1991 | Vince .......................................... 333/12 |
| 5,165,055 | 11/1992 | Metsler ....................................... 333/12 |
| 5,251,091 | 10/1993 | Ito et al. .................................... 361/152 |
| 5,315,069 | 5/1994 | Gebara ...................................... 174/250 |
| 5,321,299 | 6/1994 | Ohkawa et al. .......................... 257/528 |
| 5,341,274 | 8/1994 | Nakatani et al. ......................... 361/818 |
| 5,347,577 | 9/1994 | Takato et al. ............................. 379/399 |
| 5,373,112 | 12/1994 | Kamimura et al. ...................... 174/255 |
| 5,384,434 | 1/1995 | Mandai et al. ........................... 174/250 |
| 5,459,642 | 10/1995 | Stoddard .................................. 361/774 |
| 5,491,301 | 2/1996 | Akiba et al. ............................. 174/250 |
| 5,708,372 | 1/1998 | Igarashi et al. ............................. 326/27 |
| 5,717,359 | 2/1998 | Matsui et al. .............................. 333/12 |

Primary Examiner—Jeffrey A. Gaffin
Assistant Examiner—Peter Ganjian

[57] ABSTRACT

An EMI prevention circuit has a first ground pattern grounded to a car body and a second ground pattern connected to the first ground patter by way of an EMI condenser. A large-current ground line through which a large current flows is connected to the first ground pattern by way of an EMI condenser. A small-current ground line in which a small current flows is directly connected to the second ground pattern without using any EMI condenser in between. Because of this, even when a ground potential of the first ground pattern fluctuates by a noise due to driving a large-current load, since the second ground pattern is directly connected to a ground side of a car battery, the second ground pattern is maintained at a ground potential of the car battery and does not fluctuate. Also, when any high-frequency noise invades from a radio communication set and a portable telephone set, since the second ground pattern is connected to the first ground pattern by way of an EMI condenser, the high-frequency noise is discharged to the car body through the first ground pattern.

6 Claims, 3 Drawing Sheets

EMI PREVENTION CIRCUIT FOR A CAR-MOUNTED ELECTRONIC CONTROL UNIT

BACKGROUND OF THE INVENTION

The present invention relates to an EMI (Electro-Magnetic Interference) prevention circuit which prevents a car-mounted electronic control unit from EMI.

For example, in an electronic control unit of a fuel injection control system and so on, to prevent malfunctions due to high-frequency noises from a radio communication set and a portable telephone set or, an EMI prevention circuit shown in FIG. 1 is provided.

FIG. 1 shows a conventional EMI prevention circuit of a car-mounted electronic control unit. An electronic control unit 1 has an internal power supply line 4, signal input lines 8, 9 and 10, a small-current output line 12, a small-current ground line 13, a large-current output line 15 and a large-current ground line 16. The internal power supply line 4 provides electric power to a constant-voltage circuit 3 and the like that give a constant voltage to constant-voltage loads including a CPU 2. The signal input lines 8–10 give the CPU 2 input signals, such as sensor information and switch information, by way of interfaces 5, 6 and 7. The small-current output line 12 outputs a small-current signal, for example, to another control unit that controls an automatic transmission, by way of a small-current output control transistor 11 controlled by the CPU 2. The small-current ground line 13 is connected with a ground of the CPU 2, a ground side of the small-current output control transistor 11 and so on.

The large-current output line 15 outputs a large-current signal to drive, for example, a solenoid of an electromagnetic valve, by way of a large-current output control transistor 14 controlled by the CPU 2. The large-current ground line 16 is connected with a ground side of the large-current output control transistor 14 and so on. The electronic control unit 1 further has a single ground pattern 18 that is formed in a printed circuit board 17.

The internal power supply line 4, the signal input lines 8–10, the small-current output line 12, the small-current ground line 13, the large-current output line 15 and the large-current ground line 16 are respectively connected to the ground pattern 18 by way of EMI condensers 19, 20, 21, 22, 23, 24, 25 and 26. The ground pattern 18 is grounded to a car body 30 by way of connection with a metal case 28 of the electronic control unit 1 by a screw 27 and connection between the metal case 28 and the car body 30 by a bolt 29.

The internal power supply line 4 is connected to the power supply side of a car battery 32 by way of a switch 31.

The small-current ground line 13 and the large-current ground line 16 are respectively independently connected to a ground side of the battery 32. The ground side of the battery 32 is further grounded to the car body 30. In a composition like this, when any high-frequency noise invades from a radio communication set or portable telephone set, the high-frequency noise is brought to the ground pattern 18 through the EMI condensers 19–26 and discharged to the car body 30 by way of the metal case 28. Thereby, the electronic control unit 1 is prevented from malfunctioning due to high-frequency noises.

However, according to above-mentioned prior art, since the lines 4, 8–10, 12, 13, 15 and 16 are connected with the ground pattern 18 by way of the EMI condensers 19–26, there is a problem that a ground potential of the small-current ground line 13 fluctuates when any noise is generated in the large-current ground line 16 by driving a solenoid and so on. That is, when a solenoid of an electromagnetic valve and the like is driven by an on/off control of the large-current output control transistor 14, sometimes a noise is generated in the large-current ground line 16 by driving the solenoid.

If a noise is generated in the large-current ground line 16, a potential of the ground pattern 18 fluctuates through the EMI condenser 26, and by this fluctuation, a potential of the small-current ground line 13 fluctuates through the EMI condenser 24. When the potential of the small-current ground line 13 fluctuates, since the input signals are given as a potential difference between the signal input lines 8–10 and the small-current ground line 13, the input signals fluctuate to cause a malfunction. The problem that the ground potential of the small-current ground line 13 fluctuates does not occur unless the lines 4, 8–10, 12, 13, 15 and 16 are connected to the ground pattern 18 by way of the EMI condensers 19–26. That is, even when any noise is generated in the large-current ground line 16 due to driving a solenoid and so on, the ground potential of the small-current ground line 13 does not fluctuate because the small-current ground line 13 and the large-current ground line 16 are respectively independently connected with the ground side of the battery 32. However, in a composition like this, malfunctions are generated by external high-frequency noise from a radio communication set or a portable telephone set.

SUMMARY OF THE INVENTION

It is an object, therefore, of the present invention to overcome the disadvantages and limitations of the above-mentioned conventional EMI prevention circuit by providing a new and improved EMI prevention circuit.

Another object of the present invention is to provide an EMI prevention circuit of a car-mounted electronic control unit that can prevent fluctuations in a ground potential of signal input/output lines without compromising EMI countermeasures.

The above and other objects are attained by an EMI prevention circuit for a car-mounted electronic control unit comprising; a small-current ground line that is connected to a ground side of a car battery through which a small current flows; a large-current ground line that is connected to the ground side of said car battery independently from said small-current ground line through which a large current larger than said small current flows; a first ground pattern that is formed in a printed circuit board and is grounded to a car body through a metal case containing said printed circuit board, said large-current ground line being connected to said first ground pattern by way of a first EMI condenser; and a second ground pattern that is formed in said printed circuit board electrically independent from said first ground pattern and is connected to said first ground pattern by way of a second EMI condenser, said small-current ground line being directly connected to said second ground pattern without using any EMI condenser in between to prevent a ground potential of said second ground pattern from fluctuating by fluctuations in a ground potential of said first ground pattern.

According to a composition like this, when any noise is generated in the large-current ground line by driving a large-current load such as a solenoid, as the large-current ground line is connected to the first ground pattern by way of the first EMI condenser and the second ground pattern is connected to the first ground pattern by way of the second EMI condenser, the potential of the first ground pattern fluctuates and makes the potential of the second ground pattern fluctuate. However, since the second ground pattern is directly connected to the small-current ground line that is connected to the ground side of the car battery without using any EMI condenser in between, the second ground pattern is maintained at the potential of the small-current ground line, that is the ground potential of the car battery and does not fluctuate. On the other hand, when any high-frequency noise invades from a radio communication set or a portable telephone set, as the second ground pattern is connected to the first ground pattern by way of the second EMI condenser, the invading high-frequency noise is discharged to the car body through the first ground pattern.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, features and advantages of the present invention will be appreciated and better understood by means of the following description and accompanying drawings, which are given by way of illustrations only and thus are not limitative of the present invention and wherein.

DETAILED DESCRIPTION OF THE INVENTION

Figure 1:
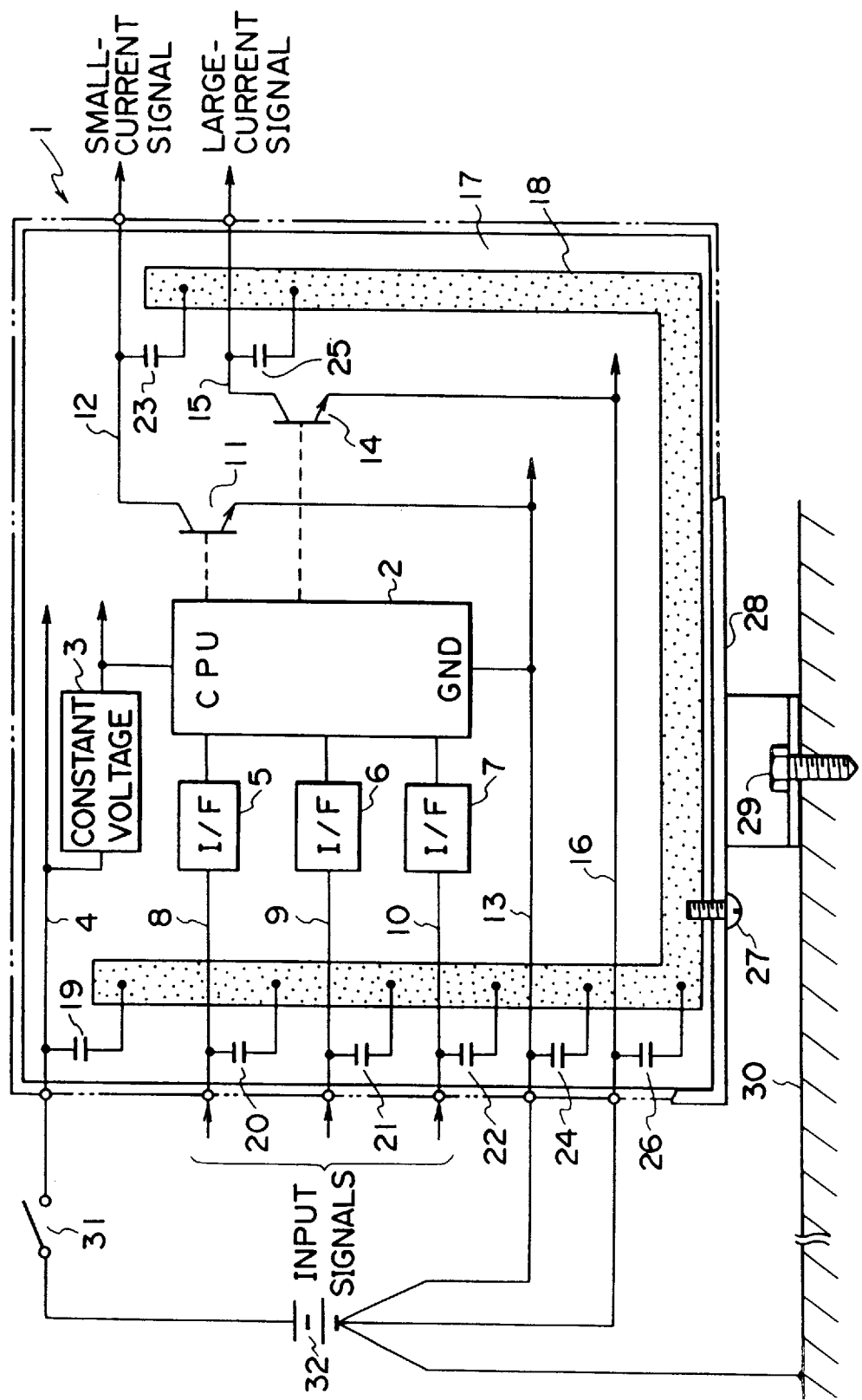
FIG. 1 is a composition drawing showing a conventional EMI prevention circuit of a car-mounted electronic control unit.
Figure 2:
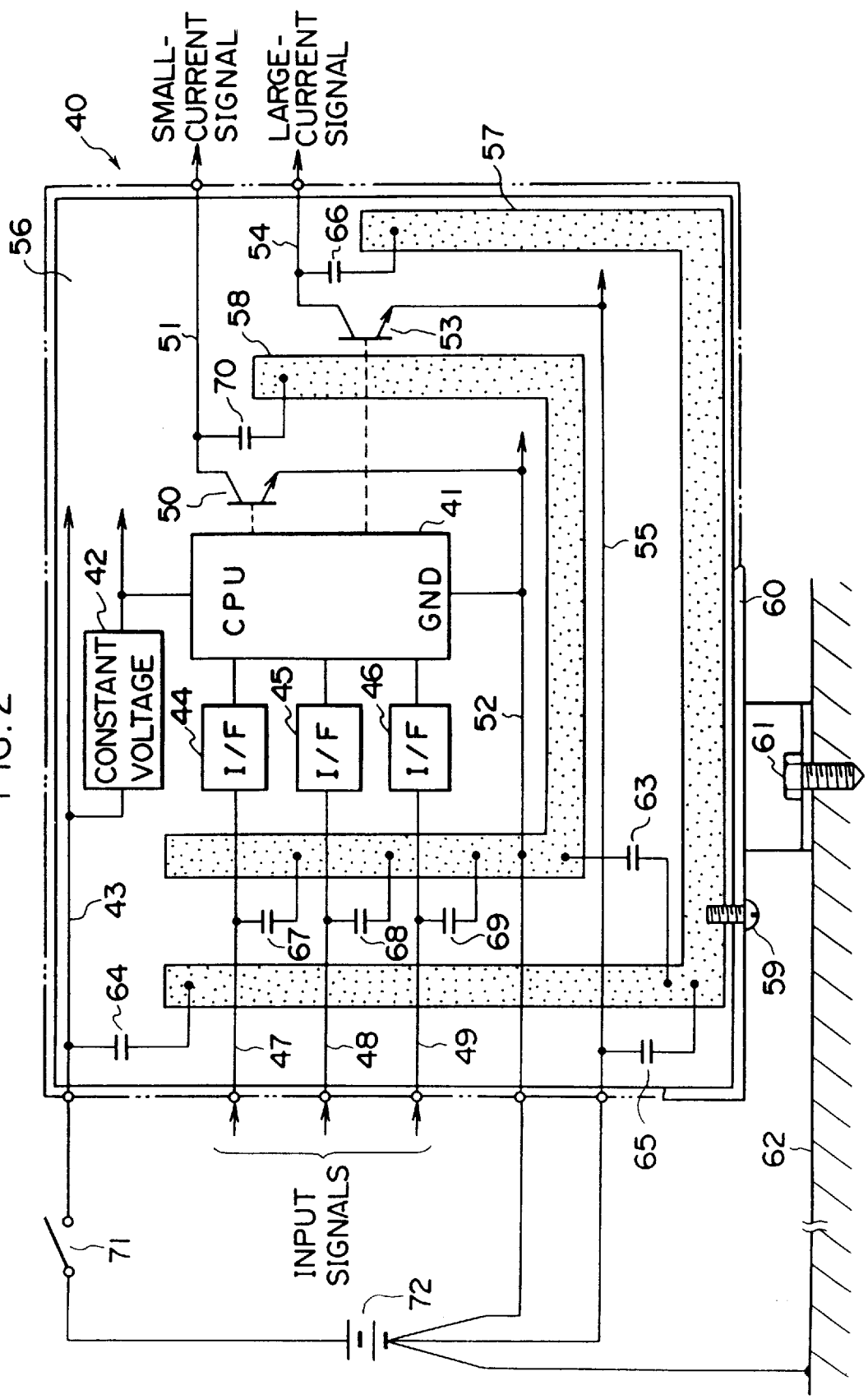
FIG. 2 is a composition drawing showing an embodiment of an EMI prevention circuit of a car-mounted electronic control unit according to the present invention.

In FIG. 2, a reference numeral 40 is an electronic control unit mounted on an automobile.

The electronic control unit 40 has an internal power supply line 43, signal input lines 47, 48 and 49, a small-current output line 51, a small-current ground line 52, a large-current output line 54, and a large-current ground line 55. The internal power supply line 43 supplies power to a constant-voltage circuit 42 and the like that give a constant voltage to constant-voltage loads including a CPU 41. The signal input lines 47–49 give the CPU 41 input signals, such as sensor information and switch information, by way of interfaces 44, 45 and 46. The input signals are given as a potential difference between the signal input lines 47–49 and the small-current ground line 52.

The small-current output line 51 outputs a small-current signal, for example, to another control unit that controls an automatic transmission, by way of a small-current output control transistor 50 controlled by the CPU 41. The small-current ground line 52 is connected with a ground of the CPU 41, a ground side of the small-current output control transistor 50 and so on.

The large-current output line 54 outputs a large-current signal to drive a solenoid of an electromagnetic valve and the like by way of a large-current output control transistor 53 controlled by the CPU 41. The large-current ground line 55 is connected with a ground side of the large-current output control transistor 53 and so on.

A large current around 1–10A flows through the large-current output line 54 and the large-current ground line 55 when a solenoid and the like is driven, and a small current that is lower than the former flows through the small-current output lint 51 and the small-current ground line 52. The small-current output control transistor 50 and the large-current output control transistor 53 are on/off controlled under the control of the CPU 41. In particular, when a large-current load, such as a solenoid and the like, is driven by the on/off control of the large-current output control transistor 53, a noise that adversely affects circuit operations tends to be generated in the large-current ground line 55 due to the driving of such a large-current load.

The electronic control unit 40 further has a first ground pattern 57 formed in a printed circuit board 56 and a second ground pattern 58 that is formed in the same printed circuit board 56 but is electrically independent from the first ground pattern 57. The first ground pattern 57 is grounded to a car body 62 by way of connection with a metal case 60 of the electronic control unit 40 by a screw 59 and connection between the metal case 60 and the car body 62 by a bolt 61. The second ground pattern 58 is connected to the first ground pattern 57 by way of an EMI condenser 63.

The internal power supply line 43 is connected to the first ground pattern 57 by way of an EMI condenser 64. The large-current ground line 55 is connected to the first ground pattern 57 by way of an EMI condenser 65. The large-current output line 54 is connected to the first ground pattern 57 by way of an EMI condenser 66. The signal input lines 47–49 are respectively connected to the second ground pattern 58 by way of EMI condensers 67, 68 and 69. The small-current ground line 52 is directly connected with the second ground pattern 58 without having any EMI condenser in between. The small-current output line 51 is connected to the second ground pattern 58 by way of an EMI condenser 70.

The internal power supply line 43 of the electronic control unit 40 is connected to a power supply side of a car battery 72 by way of a switch 71. The small-current ground line 52 and the large-current ground line 55 are respectively independently connected to a ground side of the battery 72. The ground side of the battery 72 is further grounded to the car body 62. The reason why the small-current ground line 52 and the large-current ground line 55 are provided and the ground lines 52 and 55 are respectively independently connected to the ground side of the car battery 72 is to give a sure ground potential. That is, when grounding is effected by way of contact between the metal case 60 of the electronic control unit 40 and the car body 62, a ground resistance varies by a contact resistance due to coating between the metal case 60 and the car body 62, and a sure ground potential cannot be obtained.

In the above-mentioned composition, when a noise is generated in the large-current ground line 55 by driving a solenoid and so on by an on/off control of the large-current output control transistor 53, since the large-current ground line 55 is connected to the first ground pattern 57 by way of the EMI condenser 65, a potential of the first ground pattern 57 fluctuates. When the potential of the first ground pattern 57 fluctuates, since the second ground pattern 58 is connected to the first ground pattern 57 by way of the EMI condenser 63, the first ground pattern 57 works to make a potential of the second ground pattern 58 fluctuate by way of the EMI condenser 63. However, since the second ground pattern 58 is directly connected to the small-current ground line 52 that is connected to the ground side of the battery 72 without having any EMI condenser in between, the second ground pattern 58 is maintained at the potential of the small-current ground line 52, that is the ground potential of the battery 72, and no fluctuation occurs.

On the other hand, when any high-frequency noise invades from a radio communication set and a portable telephone set or, since the second ground pattern 58 is connected to the first ground pattern 57 by way of the EMI condenser 63, the high-frequency noise is brought from the second ground pattern 58 down to the first ground pattern 57, and is discharged to the car body 62 through the first ground pattern 57 that is grounded to the car body 62 by way of the metal case 60. Also, when any high-frequency noise invades from a radio communication set on a portable telephone set to the internal power supply line 43, the large-current ground line 55 and the large-current output line 54, since the lines 43, 55 and 54 are respectively connected to the first ground pattern 57 by way of the EMI condensers 64, 65 and 66, the high-frequency noise is discharged to the car body 62 through the first ground pattern 57 likewise.

When power is supplied from the internal power supply line 43 of the electronic control unit 40 to a large-current load, such as a solenoid and the like, the internal power supply line 43 is susceptible to fluctuations. In this embodiment, the internal power supply line 43 is connected to the first ground pattern 57 by way of the EMI condenser 64. Hence, even when the internal power supply line 43 fluctuates, signal input/output lines, that is the signal input lines 47–49, the small-current ground line 52 and the small-current output line 51, are not influenced by fluctuations of the internal power supply line 43. That is, even when the potential of the first ground pattern 57 fluctuates by fluctuations of the internal power supply line 43, since the small-current ground line 52 is directly connected to the second ground pattern 58, the second ground pattern 58 is maintained at the ground potential of the battery 72, and so the signal input/output lines are not affected by fluctuations of the internal power supply line 43.

In addition, in this embodiment, the small-current output line 51 is connected to the second ground pattern 58 by way of the EMI condenser 70, and the large-current output line 54 is connected to the first ground pattern 57 by way of the EMI condenser 66. Because of this, even when an electromagnetic wave is generated by an on/off of the small-current output control transistor 50 or the large-current output control transistor 53, the electromagnetic wave is suppressed and does not adversely affect a car radio communication set and the like. Also, the influence of a noise derived from driving a large-current load, such as a solenoid, does not reach the small-current output line 51.

Figure 3:
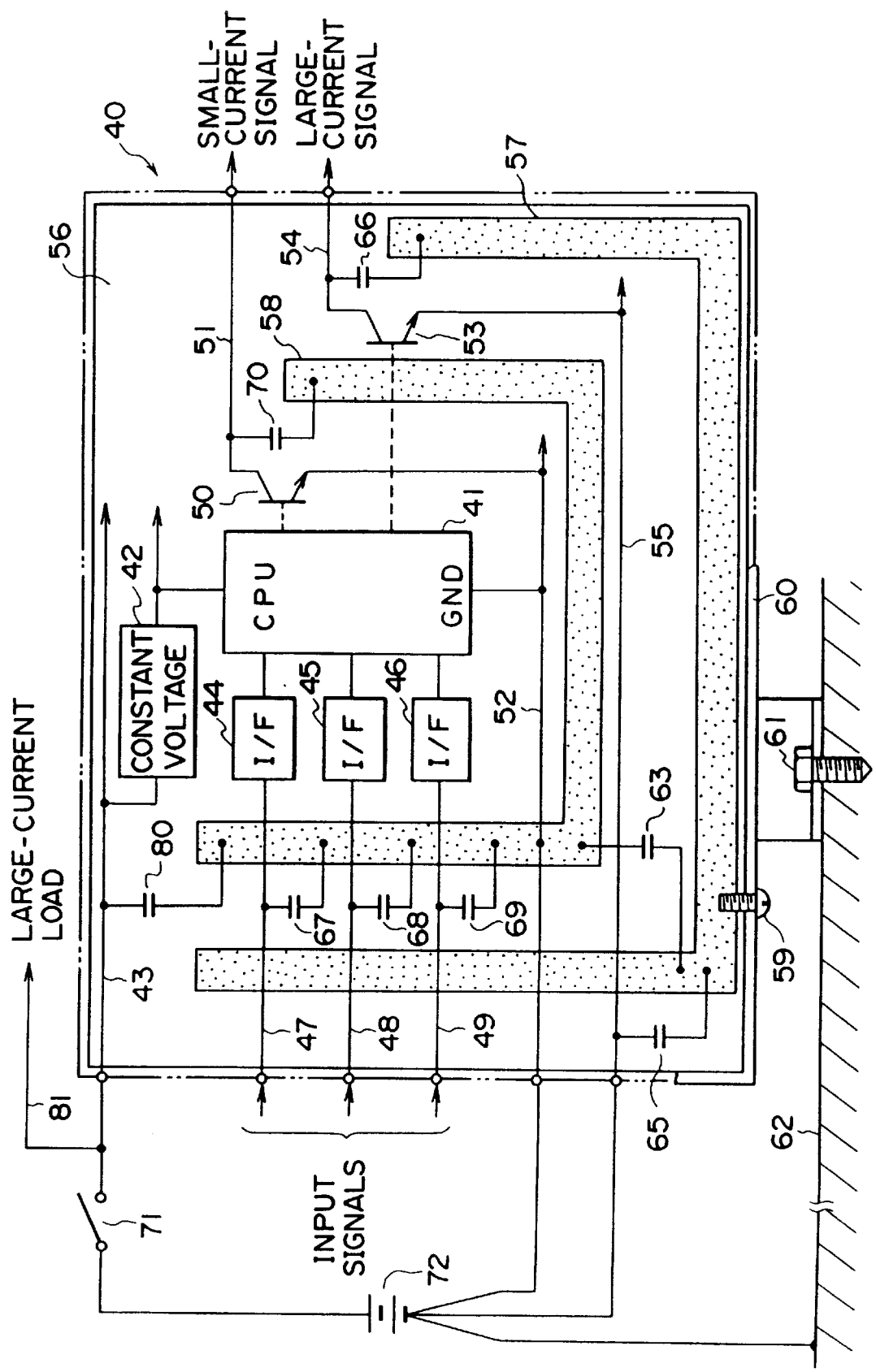
FIG. 3 is a composition drawing showing another embodiment of an EMI prevention circuit of a car-mounted electronic control unit according to the present invention.

FIG. 3 is a composition drawing showing another embodiment of an EMI prevention circuit of a car-mounted electronic control unit according to the present invention. In this embodiment, instead of connecting the internal power supply line 43 to the first ground pattern 57 by way of the EMI condenser 64, the internal power supply line 43 is connected to the second ground pattern 58 by way of the EMI condenser 80. Also, the external power supply line 81 for supplying power to a large-current load, such as a solenoid and the like, is provided. The external power supply line 81 supplies power to the large-current load without using the internal power supply line 43 of the electronic control unit 40 in between. The composition of other parts is as described about the embodiment of FIG. 2.

According to a composition like this, since power is supplied to the large-current load without using the internal power supply line 43 of the electronic control unit 40 in between, the internal power supply line 43 does not easily fluctuate. When the internal power supply line 43 of the electronic control unit 40 which does not easily fluctuate is connected to the first ground pattern 57 by way of an EMI condenser, as shown in FIG. 2, the first ground pattern 57 fluctuates and also makes the internal power supply line 43 fluctuate.

In this embodiment of FIG. 3, since the internal power supply line 43 is connected to the second ground pattern 58 by way of the EMI condenser 81, it is possible to prevent fluctuations in the first ground pattern 57 from influencing on the internal power supply line 43. When any high-frequency noise invades from a radio communication set or a portable telephone set to the internal power supply line 43 of the electronic control unit 40, the high-frequency noise is discharged from the second ground pattern 58 to the car body 62 through the first ground pattern 57.

As described above in detail, according to the embodiments, the first ground pattern 57 that is grounded to the car body 62 through the metal case 60 and the second ground pattern 58 that is connected to the first ground pattern 57 by way of the EMI condenser 63 are provided. The signal input lines 47–49 are connected with the second ground pattern 58 by way of the EMI condensers 67–69, and the small-current ground line 52 is directly connected with the second ground pattern 58 without using any EMI condenser in between. The large-current ground line 55 is connected to the first ground pattern 57 by way of the EMI condenser 65. Hence, even when the potential of the first ground pattern 57 fluctuates by a noise due to driving a large-current load, since the second ground pattern 58 is directly connected to the ground side of the car battery 72, the second ground pattern 58 is maintained at the ground potential of the battery 72 and does not fluctuate. Also, when any high-frequency noise invades from a radio communication set or a portable telephone set, since the second ground pattern 58 is connected to the first ground pattern 57 by way of the EMI condenser 63, the invading high-frequency noise is discharged to the car body 62 through the first ground pattern 57.

In addition to above-mentioned composition, the internal power supply line 43 of the electronic control unit 40 that is connected to the power supply side of the car battery 72 is connected to the first ground pattern 57 by way of the EMI condenser 64. Thus, in the case in which the internal power supply line 43 is susceptible to fluctuations, such as the case of supplying power to a large-current load, such as a solenoid and the like, from the internal power supply line 43 of the electronic control unit 40, it is possible to prevent fluctuations in the internal power supply line 43 from influencing signal input/output lines 47–49 and 51.

Instead of connecting the internal power supply line 43 to the first ground pattern 57 by way of the EMI condenser 64, the internal power supply line 43 of the electronic control unit 40 may be connected to the second ground pattern 58 by way of the EMI condenser 80. According to this composition, when the internal power supply line 43 does not easily fluctuate, for example, when power is supplied to a large-current load from the car battery 72 without using the internal power supply line 43 of the electronic control unit 40 in between, it is possible to prevent fluctuations in the first ground line 57 from influencing the internal power supply line 43.

The small-current output line 51 of the electronic control unit 40 is connected to the second ground pattern 58 by way of the EMI condenser 70, and the large-current output line 54 is connected to the first ground pattern 57 by way of the EMI condenser 66. Because of this, it is possible to provide an EMI prevention measure for the large-current output line 54 and the small-current output line 51, and suppress an electromagnetic wave that is generated by an on/off control of the transistors 50 and 53. Further, it is possible to prevent a noise due to driving a large-current load, such as a solenoid and the like, from influencing the small-current output line 51.

From the foregoing it will now be apparent that a new and improved EMI prevention circuit has been invented. It should be understood of course that the embodiments disclosed are merely illustrative and are not intended to limit the scope of the invention. Reference should be made to the appended claims, rather than the specification as indicating the scope of the invention.

What is claimed is:

1. An EMI prevention circuit for a car-mounted electronic control unit comprising;
    a small-current ground line that is connected to a ground side of a car battery through which a small current flows;
    a large-current ground line that is connected to the ground side of said car battery independently from said small-current ground line through which a large current larger than said small current flows;
    a first ground pattern that is formed in a printed circuit board and is grounded to a car body through a metal case containing said printed circuit board, said large-current ground line being connected to said first ground pattern by way of a first EMI condenser; and
    a second ground pattern that is formed in said printed circuit board electrically independent from said first ground pattern and is connected to said first ground pattern by way of a second EMI condenser, said small-current ground line being directly connected to said second ground pattern without using any EMI condenser in between to prevent a ground potential of said second ground pattern from fluctuating by fluctuations in a ground potential of said first ground pattern.

2. The EMI prevention circuit of claim 1 further including at least one signal input line for giving a signal from outside based on a potential difference between the signal input line and said small-current ground line, said signal input line being connected with said second ground pattern by way of a third EMI condenser.

3. The EMI prevention circuit of claim 1 further including an internal power supply line that is connected to a power supply side of said car battery, said internal power supply line being connected with said first ground pattern by way of a fourth EMI condenser.

4. The EMI prevention circuit of claim 1 further including an internal power supply line that is connected to a power supply side of said car battery, said internal power supply line being connected with said second ground pattern by way of a fifth EMI condenser.

5. The EMI prevention circuit of claim 1 further including at least one small-current output line for outputting a small-current signal that is given by an on/off control of switching means, said small-current output line being connected with said second ground pattern by way of a sixth EMI condenser.

6. The EMI prevention circuit of claim 1 further including at least one large-current output line for outputting a large-current signal that is given by an on/off control of switching means, said large-current output line being connected with said first ground pattern by way of a seventh EMI condenser.

* * * * *